(12) United States Patent
Kosa et al.

(10) Patent No.: US 7,632,614 B2
(45) Date of Patent: Dec. 15, 2009

(54) CIRCUIT PATTERN EXPOSURE METHOD AND MASK

(75) Inventors: Nobue Kosa, Tokyo (JP); Tadao Yasuzato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 382 days.

(21) Appl. No.: 11/648,541

(22) Filed: Jan. 3, 2007

(65) Prior Publication Data

US 2007/0160918 A1    Jul. 12, 2007

(30) Foreign Application Priority Data

Jan. 6, 2006    (JP) .............................. 2006-001357

(51) Int. Cl.
*G03F 1/00*    (2006.01)

(52) U.S. Cl. ......................................................... 430/5
(58) Field of Classification Search ...................... 430/5, 430/322, 323, 324; 716/19, 20, 21
See application file for complete search history.

(56) References Cited

U.S. PATENT DOCUMENTS 6,074,787 A * 6/2000 Takeuchi ........................ 430/5
6,620,556 B2 * 9/2003 Ohsaki ........................... 430/5

FOREIGN PATENT DOCUMENTS

| JP | 04-268714 | 9/1992 |
| JP | 05-002261 | 1/1993 |
| JP | 10-186629 | 7/1998 |
| JP | 2002-116529 | 4/2002 |
| JP | 2004-272228 | 9/2004 |

* cited by examiner

*Primary Examiner*—Stephen Rosasco
(74) *Attorney, Agent, or Firm*—Young & Thompson

(57) ABSTRACT

A circuit pattern exposure method for irradiating illumination light onto a mask to transfer (offset) mask patterns that are formed in the mask to a semiconductor substrate, wherein the mask includes a plurality of main mask patterns that are arranged at a prescribed pitch and auxiliary mask patterns that are arranged outside the outermost main mask pattern and that are not to be transferred (offset) to the semiconductor substrate; the auxiliary mask patterns are provided with a first auxiliary mask row that is arranged adjacent to the outermost main mask pattern and a second auxiliary mask row that is arranged adjacent to the first auxiliary mask row; and the first auxiliary mask row and the second auxiliary mask row are arranged at a pitch that is narrower than the pitch of arrangement of the main mask patterns.

10 Claims, 8 Drawing Sheets

CIRCUIT PATTERN EXPOSURE METHOD AND MASK

BACKGROUND OF THE INVENTION

1. Field of the Invention

The present invention relates to a circuit pattern exposure method for forming circuit patterns on a semiconductor substrate and to a mask that is used in this method.

2. Description of the Related Art

With technological advances in the field of photolithography, micro circuit patterns can now be formed having a pitch that is less than one-half the optical wavelength of the exposure light. In particular, in the formation of a dense pattern such as a line/space pattern (hereinbelow abbreviated as "L/S pattern") in which lines and spaces are repeated at a fixed pitch, sufficient depth of focus is obtained by the application of an oblique-incidence illumination method. The oblique-incidence illumination method is a method in which the vertical-incidence component of the illumination light that is irradiated onto a mask is cut such that the mask pattern is illuminated by the oblique-incidence component. In normal image formation, three light beams from the mask pattern, i.e., the 0-order diffracted light and the "+" and "−" first-order diffracted light, are condensed by a projection lens (image formation by three-beam interference). In contrast, in oblique-incidence illumination, one of the ± first-order diffracted lights is discarded, and two light beams, the 0-order diffracted light and one of the ± first-order diffracted lights, are condensed by a projection lens (image formation by two-beam interference).

When comparing the best-focused states of image formation realized by three-beam interference and image formation realized by two-beam interference, the image contrast in image formation by two-beam interference is reduced, because the extent of the "+" or "−" first-order diffracted light has been discarded. However, in two-beam interference, the angle of incidence on the image-formation plane (the semiconductor substrate) is one-half that for three-beam interference. As a result, the degree of blurring when out of focus is less in two-beam interference imagery than in three-beam interference imagery. Sufficient light intensity distribution can therefore be obtained in circuit pattern formation over a broader range of focus. In addition, it is known that the use of a half-tone phase-shift mask can extend the depth of focus (the range of focus over which circuit patterns can be formed). Here, a half-tone phase-shift mask is a mask in which a shield region is formed on a mask to semi-transparency (transmittance of 2-20%), whereby the phase of light that passes through the shield region is rotated 180° with respect to the phase of light that passes through the non-shielded region around the periphery of the shield region.

The use of a half-tone phase-shift mask and an oblique-incidence illumination method in the formation of an S/L pattern that produces diffracted light can improve the balance between the 0-order diffracted light and the "+" first-order diffracted light (or the "−" first-order diffracted light) and can further improve contrast.

On the other hand, a modified illumination method such as oblique-incidence illumination has little effect on an isolated pattern in which diffracted light does not occur, and the depth of focus is not greatly extended. Illumination optics having lower NA or lower coherence are more effective for extending the depth of focus of an isolated pattern. Here, illumination optics having lower NA means that the mask pattern is only illuminated by light that is close to the vertical component. Even when using a half-tone phase-shift mask, low-coherence illumination extends the depth of focus. Essentially, it has been difficult to simultaneously improve the exposure characteristics of both an isolated pattern and a highly concentrated pattern.

However, a method has been investigated in which a mask is used that is provided with mask patterns referred to as "auxiliary patterns" which do not themselves directly contribute to the formation of circuit patterns. Auxiliary patterns are disclosed in JP-A-H04-268714 (third page, FIG. 4(a)(b)). According to this publication, when using an oblique-incidence illumination method to form micro hole patterns and slit patterns, the auxiliary patterns are arranged on the mask to extend the depth of focus. The document further discloses that a similar effect can be obtained when forming line patterns. Essentially, the publication shows that when a mask, in which main patterns corresponding to the intended circuit patterns and the above-described auxiliary patterns are arranged, is used under modified illumination conditions, the image formation state approaches the state of image formation in two-beam interference and the depth of focus is extended. In this case, the position and dimensions of the auxiliary patterns greatly influence the depth of focus.

The optimum value of the spacing between the auxiliary patterns and the main patterns varies according to the dimensions of these patterns and optical conditions. Typically, the optimum value is approximately 1.5 times the limiting resolution of the optical conditions. JP-A-H05-2261 (third page, FIG. 1) discloses that the combined use of the oblique-incidence illumination method and a half-tone phase-shift mask can improve the decrease in contrast in two-beam interference image formation. In two-beam interference image formation, the 0-order diffracted light having information relating to the average brightness is excessively stronger than the "+" first-order diffracted light (or the "−" first-order diffracted light) having information relating to pitch. As a result, the amplitude of the distribution of the intensity of exposure light becomes smaller than the average value, and the contrast drops. Thus, using a half-tone phase-shift mask to reduce 0-order diffracted light improves the balance of light intensity and suppresses a decrease in contrast.

As described in the foregoing explanation, when the oblique-incidence illumination method was used, a mask was used in which auxiliary patterns were arranged at the periphery of concentrated patterns in which the effect of extending the depth of focus was difficult to obtain. More accurately, exposure was carried out using a mask in which auxiliary patterns were arranged at the periphery of the main patterns that corresponded to circuit patterns that were concentrated. As a result, the outermost patterns of concentrated circuit patterns could be realized in the desired dimensions. Alternatively, the desired depth of focus was obtained.

However, in the prior art, no consideration was given to the dimensional accuracy of the patterns that were inward from the outermost portion of the patterns when forming concentrated circuit patterns. The inventors of the present invention have discovered that even when the desired dimensions are realized for the outermost portion of concentrated circuit patterns, the dimensions of patterns within the outermost portion tend to vary.

SUMMARY OF THE INVENTION

It is an object of the present invention to reduce to the greatest extent possible the dimensional variation of not only the outmost pattern of concentrated circuit patterns, but also the patterns that are located around the outermost pattern.

The above and other objects, features, and advantages of the present invention will become apparent from the following description with reference to the accompanying drawings, which illustrate examples of the present invention.

DETAILED DESCRIPTION OF THE PREFERRED EMBODIMENTS

This application is based upon and claims the benefit of priority from Japanese Patent Application No. 001357/06 filed on Jan. 6, 2006, the content of which is incorporated by reference.

Figure 1:
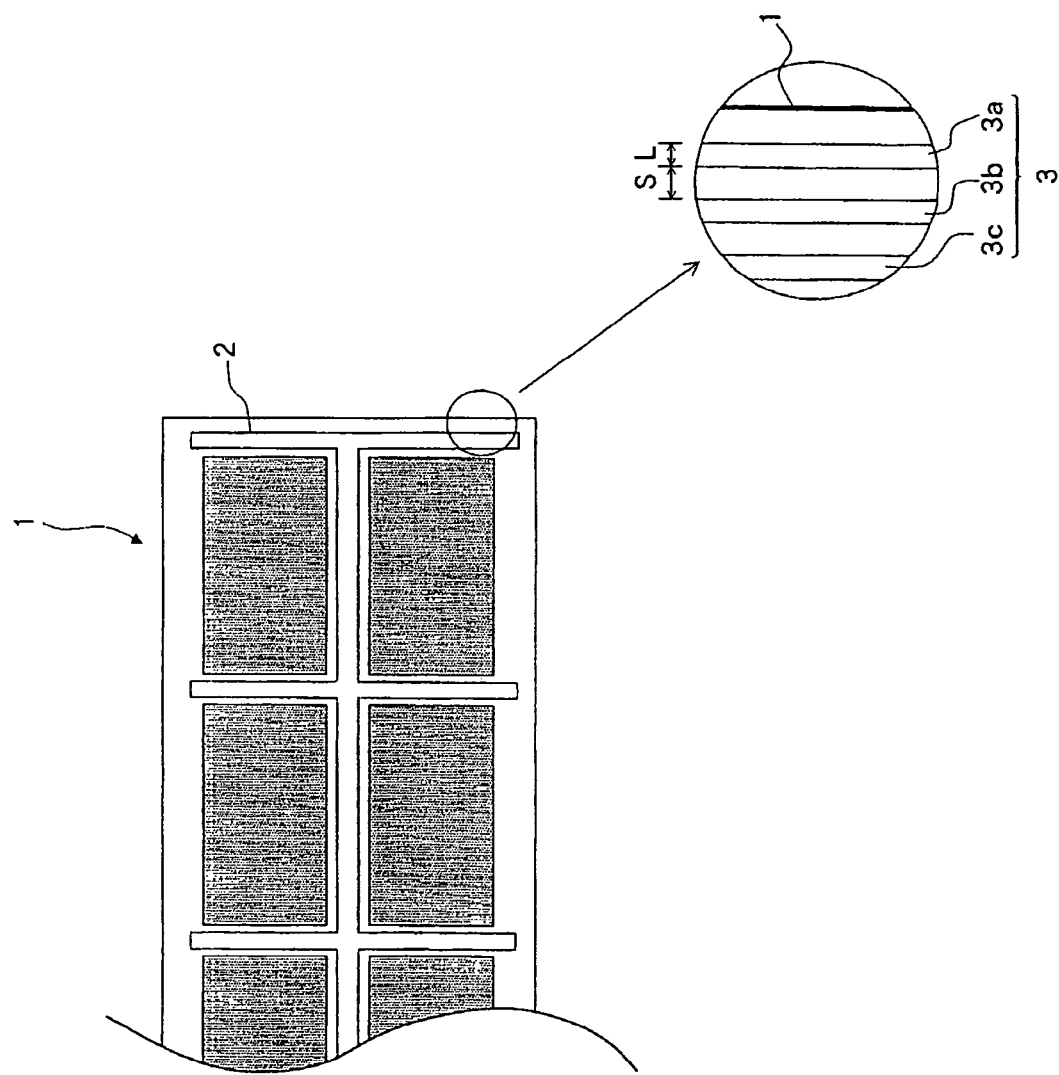
FIG. 1 is a schematic view showing an example of DRAM that has been fabricated using the circuit pattern exposure method of the present invention.

The circuit pattern exposure method of the present embodiment is directed to forming semiconductor circuit patterns of the type shown in the schematic view of FIG. 1. This semiconductor circuit pattern is circuit pattern 2 of DRAM (Dynamic Random Access Memory) 1. More specifically, this is an L/S (Line and Space) pattern in which a multiplicity of lines 3 of a prescribed line width are formed at a prescribed pitch. More particularly, FIG. 1 gives an enlarged view of only outermost line 3a and the two lines 3b and 3c that are arranged immediately inward from line 3a. The line width (L) of all lines 3 that includes lines 3a, 3b, and 3c is 100 nm, and the distance (S) between each of lines 3 is 100 nm.

Explanation next regards the exposure method of circuit pattern 2 shown in FIG. 1. Since there is no particular difference from the exposure method of the prior art other than the construction of the mask that is used, detailed explanation regards only the construction of the mask, and only an outline of other aspects of the method will be given. In the circuit pattern exposure method of this example, circuit pattern 2 is formed by means of KrF (krypton fluoride) exposure. More specifically, exposure is implemented using annulose lighting (oblique-incidence illumination by light in which the central 80% of circular spots is shielded) in which the numerical aperture (NA) is 0.85, the coherent factor (σ) is 0.85, and the shielding rate of 4/5.

Figure 2:
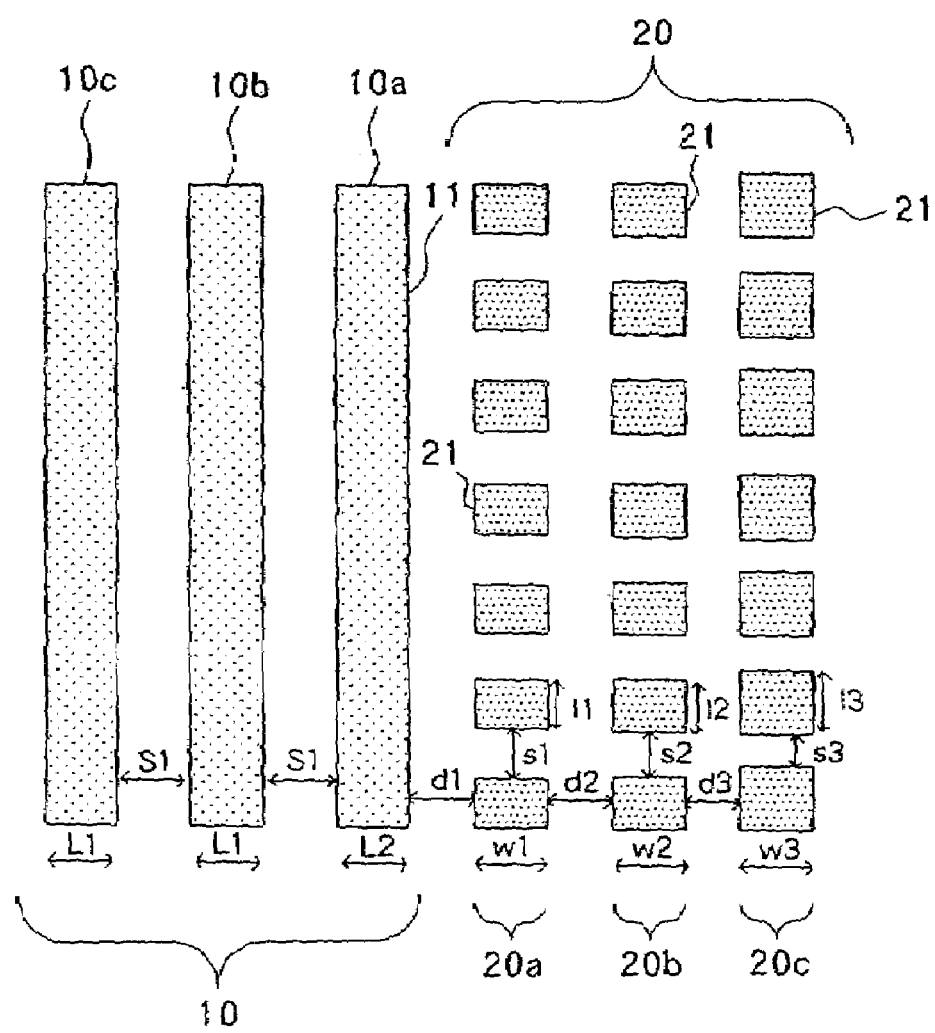
FIG. 2 is a schematic view showing an example of the mask used in the circuit pattern exposure method of the present invention.

FIG. 2 is a schematic plan view showing a portion of the mask used in the circuit pattern exposure method of the present example. This mask is a half-tone phase-shift mask in which the shield rate of the shielded region is 6% and the phase difference is 180°. In this mask, main mask patterns 10 that correspond to circuit patterns 2 (lines 3) and auxiliary mask patterns 20 are arranged. The above-described shielded region is the region in which main mask patterns 10 and auxiliary mask patterns 20 are formed.

Main mask patterns 10 are formed in the same form (strips) as lines 3. Main mask pattern 10a shown in the figure corresponds to line 3a shown in FIG. 1. Main mask pattern 10b similarly corresponds to line 3b, and main mask pattern 10c corresponds to line 3c. As a result, the width (L1) of main mask patterns 10b and 10c is the same 100 nm the as line width (L) of lines 3b and 3c and the other lines that are not shown. However, the width (L2) of only main mask pattern 10a that corresponds to line 3a is 103 nm (a bias of 3 nm is added). In addition, the distance (S1) between adjacent main mask patterns 10 is 100 nm.

Auxiliary mask patterns 20 are formed from auxiliary mask rows 20a, 20b, and 20c that are arranged parallel to main mask patterns 10. Each of auxiliary mask rows 20a, 20b, and 20c are formed by a plurality of micro-masks 21 that are arranged extending in the longitudinal direction (vertical direction) of main mask patterns 10. The pitch of the rows in the vertical direction of micro-masks 21 that make up each of auxiliary mask rows 20a, 20b, and 20c is equal to or less than the limiting resolution of the exposure device. As a result, each of auxiliary mask rows 20a, 20b, and 20c exhibits an effect that approaches that of a substantially linear auxiliary pattern. On the other hand, the interspersing of micro-masks to make up each auxiliary mask row has several merits. As a first advantage, an auxiliary mask row can be easily formed in the vicinity of a main mask pattern even when the main mask pattern has a repeating non-linear pattern. For example, in a DRAM memory cell array, the circuit patterns are arranged not in the X-Y direction but in a zigzag form in order to lay out the capacitance pattern with the greatest possible density. In such a case, as a natural consequence, main mask patterns also repeat in zigzag form, and the border of the outermost portion of the main mask patterns is uneven. However, interspersing micro-masks facilitates the formation of auxiliary mask rows along the above-described uneven border.

Referring again to FIG. 2, the auxiliary mask rows are distinguished in the following explanation as first auxiliary mask row 20a, second auxiliary mask row 20b, and third auxiliary mask row 20c in order from the auxiliary mask row adjacent to main mask pattern 10a. However, these labels and distinctions are used only for the sake of convenience in this explanation.

First auxiliary mask row 20a is made up from micro-masks 21 each having a width (w1) of 100 nm and a length (l1) of 70 nm, the distance (s1) between each of micro-masks 21 being 70 nm. In addition, the distance (d1) between main mask pattern 10a and first auxiliary mask row 20a is 85 nm.

Second auxiliary mask row 20b is made up from micro-masks 21 each having a width (w2) of 100 nm and a length (l2) of 75 nm, the distance (s2) between each of micro-masks 21 being 65 nm. In addition, the distance (d2) between first auxiliary mask row 20a and second auxiliary mask row 20b is 75 nm.

Third auxiliary mask row 20c is made up of micro-masks 21 each having a width (w3) of 100 nm and a length (l3) of 90 nm, the distance (s3) between each of micro-masks 21 being 40 nm. In addition, the distance (d3) between second auxiliary mask row 20b and third auxiliary mask row 20c is 75 nm.

As is clear from the above-described numerical values, micro-masks 21 that make up second auxiliary mask row 20b have a dimension in the vertical direction (l2) that is greater than that of micro-masks 21 (l1) that make up first auxiliary mask row 20a. In addition, micro-masks 21 that make up third auxiliary mask row 20c have a dimension in the vertical direction (l3) that is greater than that (l2) of micro-masks 21 that make up auxiliary mask row 20b. In other words, the effective dimensions of the auxiliary mask rows increase with increasing distance from main mask pattern 10a. In addition, the pitch of auxiliary mask rows 20a-20c is 175 nm, which is less than the pitch of line 3 (200 nm).

Figure 3:
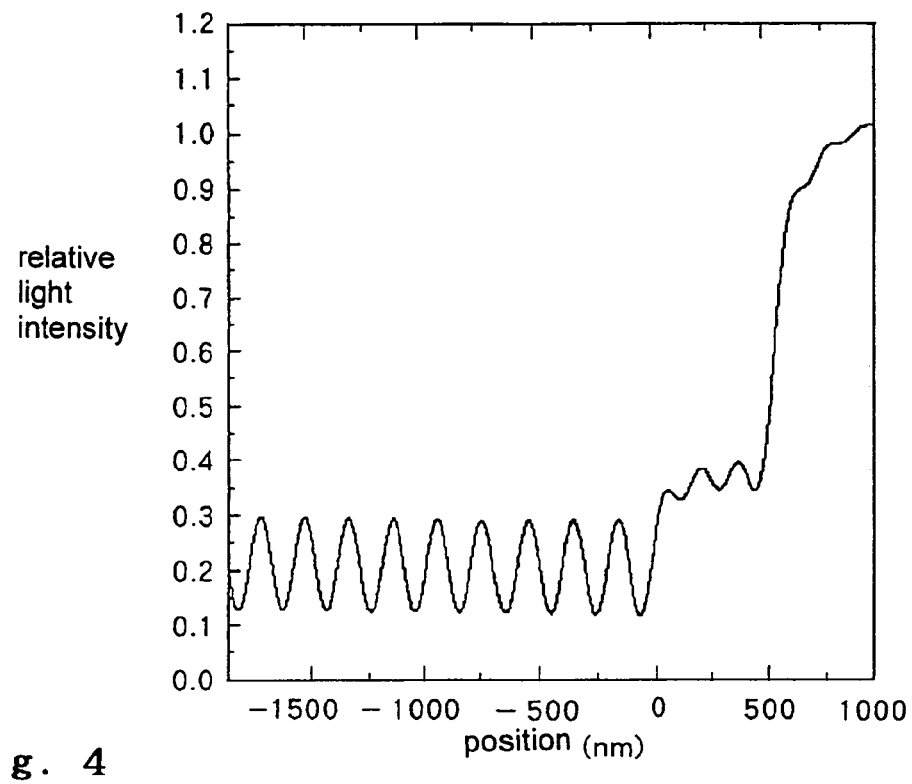
FIG. 3 shows an example of the distribution of the intensity of exposure light.

The graph of FIG. 3 shows the distribution of the intensity of exposure light when using the mask of FIG. 2. This graph shows the distribution of light intensity in a direction orthogonal to the longitudinal direction of main mask patterns 10 shown in FIG. 2, and the 0 position on the horizontal axis corresponds to the position of edge 11 of main mask pattern 10a. In addition, the "−" direction of the horizontal axis corresponds to the region in which main mask patterns 10 are arranged, and the "+" direction corresponds to the region in which auxiliary mask patterns 20 are arranged. From this graph, it can be seen that the light intensity drops to less than 0.4 in the region in which auxiliary mask patterns 20 are arranged. Here, auxiliary mask rows 20a, 20b, and 20c that make up auxiliary mask patterns 20 are each arranged at a narrow pitch (175 nm) that is less than the limiting resolution of the exposure device, whereby a region in which light intensity is low is formed within a fixed range outside main mask pattern 10a such that auxiliary mask patterns 20 are not transferred (offset). As a result, a sharp change in light intensity at edge 11 of main mask pattern 10a is avoided and the light intensity distribution is stabilized. Accordingly, the light intensity distribution is stabilized not only at the outermost line 3a (FIG. 1) that is formed by the transfer (offset) of main mask pattern 10a, but also within the region from lines 3a to line 3c that is inward from this outermost line 3a. This configuration means that dimensional variation is reduced in the periphery of the circuit pattern that includes lines 3a, 3b, and 3c. In other words, dimensional variation is reduced not only in the outermost portion of the circuit pattern but also in the periphery of the circuit pattern that includes the outermost lines. In actuality, dimensional variation of lines in the periphery of the circuit pattern can be kept within 1 nm.

Figure 4:
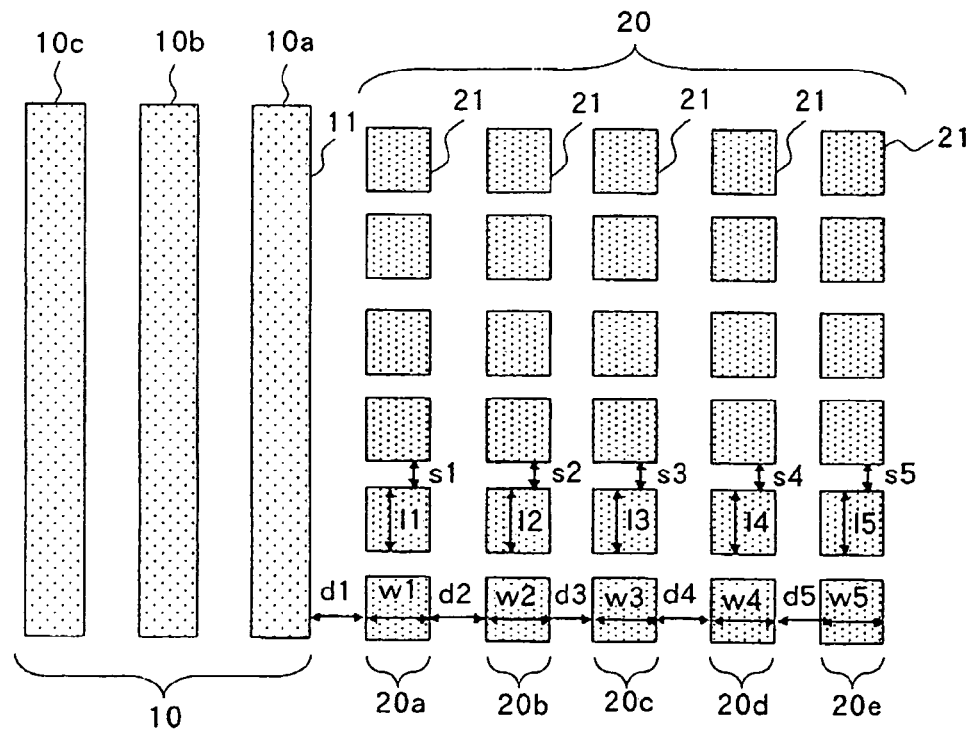
FIG. 4 is a schematic view showing another example of a mask used in the circuit pattern exposure method of the present invention.

FIG. 4 shows another example of a mask that is used in the circuit pattern exposure method of the present invention. This mask shares the basic configuration of the mask shown in FIG. 2, and as a result, configurations that are identical to those of the mask shown in FIG. 2 are given the same reference numbers in FIG. 4 and explanation of these parts is omitted. The first point of difference between the mask shown in FIG. 4 and the mask shown in FIG. 2 is the addition of fourth auxiliary mask row 20d and fifth auxiliary mask row 20e. The second point of difference is that the widths of main mask patterns 10 are all 100 nm (a bias is not added).

Table 1 shows each of the dimensions of auxiliary mask patterns 20 shown in FIG. 4. In addition, the auxiliary mask rows can be increased or decreased. When the auxiliary mask rows are increased or decreased, the dimensions of each row can also be modified as appropriate. Table 1 shows each of the dimensions of the auxiliary mask patterns for cases in which the number of auxiliary mask rows varies from one row to five rows. Five auxiliary mask rows are arranged in the mask shown in FIG. 4, and the numerical values of the far right column of Table 1 are the dimensions of auxiliary mask rows 20a-20e that are shown in FIG. 4. Each of the dimensions shown in Table 1 is an example.

Table 1

Next, Table 2 shows the results of measuring the dimensions (line widths) of lines of circuit patterns that are exposed by masks in which auxiliary mask rows are added one by one, such as a mask in which auxiliary mask pattern 20 shown in FIG. 4 is not arranged (a mask of only main mask patterns 10), a mask in which only auxiliary mask row 20a is arranged in addition to main mask patterns 10, a mask in which auxiliary mask rows 20a and 20b are arranged, and so on. The numerical values shown in the extreme left column of Table 2 show the positions of the lines of the exposed circuit pattern. More specifically, these numerical values show the positions of each line when the outermost line is taken as a reference, "1" being the outermost line, "2" being the line that is one line inward from the outermost line (the second line), "3" being the line two lines inward (the third line), and so on. The exposure conditions in this measurement are the same as previously described. In other words, in the case of a KrF exposure using annulose lighting in which the numerical aperture (NA) is 0.85, the coherent factor ($\sigma$) is 0.85, and shielding rate is 4/5.

Table 2

From Table 2, it can be seen that, for a case of using a mask in which auxiliary mask patterns 20 are not arranged (when auxiliary patterns are absent), there is a trend in which the outermost line is extremely narrow and the third line is particularly thick. On the other hand, it can also be seen that this trend is mitigated as the number of auxiliary mask rows increases. In particular, it was confirmed that, under the current exposure conditions, arranging three auxiliary mask rows suppressed variation in the dimensions of the second and subsequent lines to within 1 nm.

Figure 5:
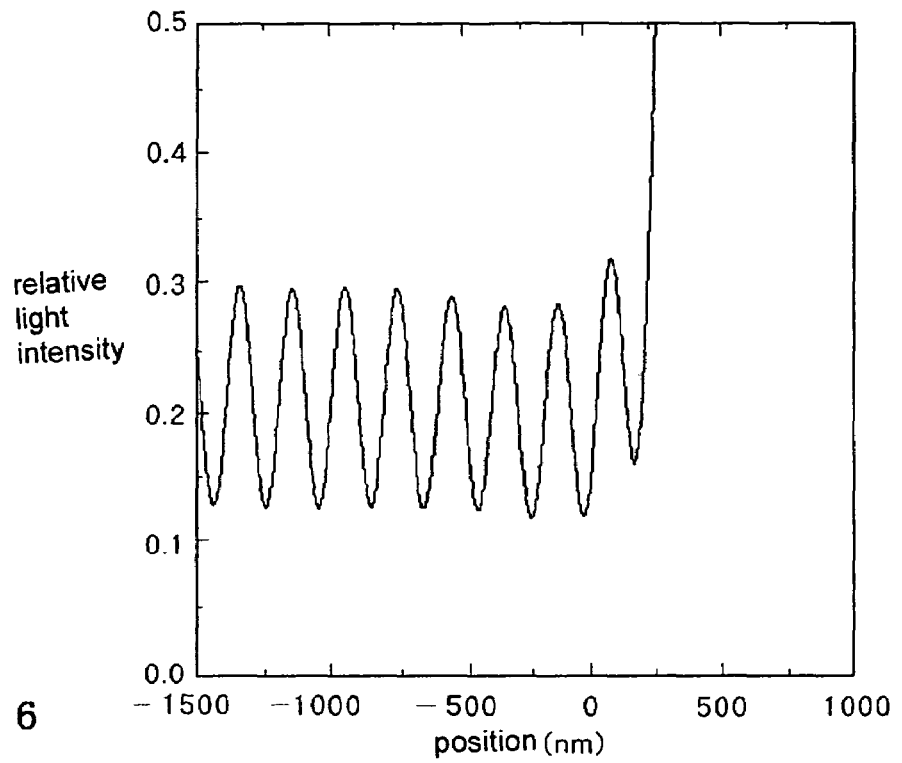
FIG. 5 shows the distribution of the intensity of exposure light.

The graph shown in FIG. 5 shows the distribution of the intensity of exposure light when using a mask in which auxiliary mask patterns are not arranged in the above-described measurements. The "0" position on the horizontal axis corresponds to the position of edge 11 of main mask pattern 10a shown in FIG. 4. From this graph, it can be seen that the minimum value of the light intensity in main mask pattern 10a rises when auxiliary mask patterns 20 are not arranged at the outer side of main mask pattern 10a. Further, it can be seen that the minimum light intensity also drops in main mask patterns 10b and 10c that are inward from main mask pattern 10a. These changes in the minimum values of the distribution of the intensity of exposure light give rise to variations in the dimensions of the lines that are transferred (offset).

Figure 6:
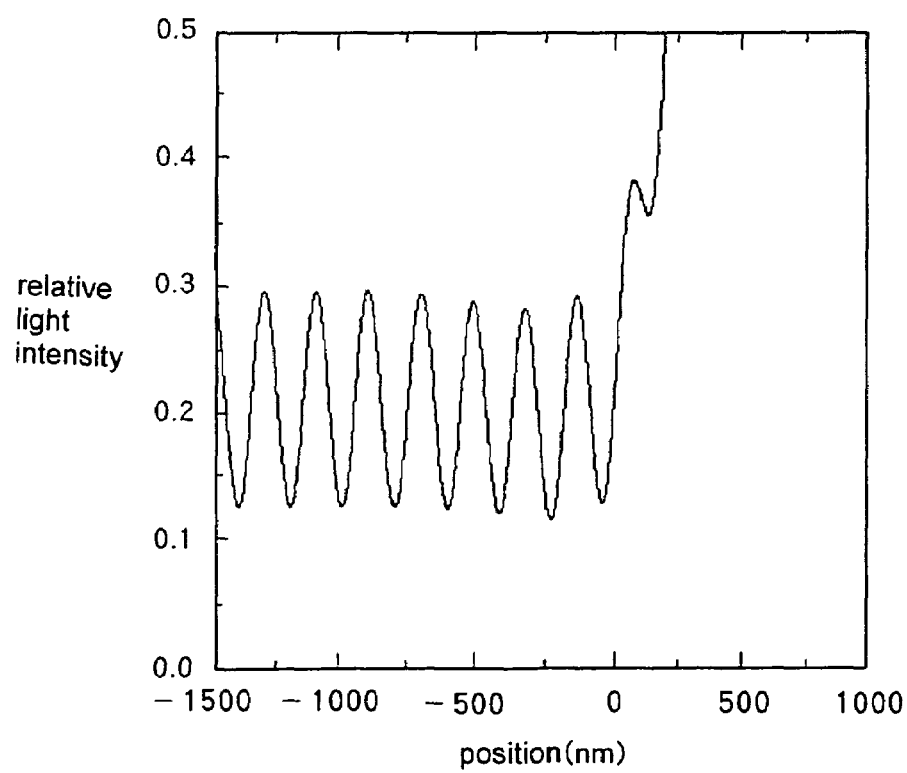
FIG. 6 shows another example of the distribution of the intensity of exposure light.

The graph of FIG. 6 shows the distribution of the intensity of exposure light when using a mask in which only auxiliary mask row 20a is arranged in addition to main mask patterns 10 shown in FIG. 4. From this graph, it can be seen that by only arranging one auxiliary mask row, the light intensity in main mask pattern 10a is greatly improved and the difference in light intensity between main mask pattern 10a and main mask patterns 10b and 10c that are inward from main mask pattern 10a is reduced.

Figure 7:
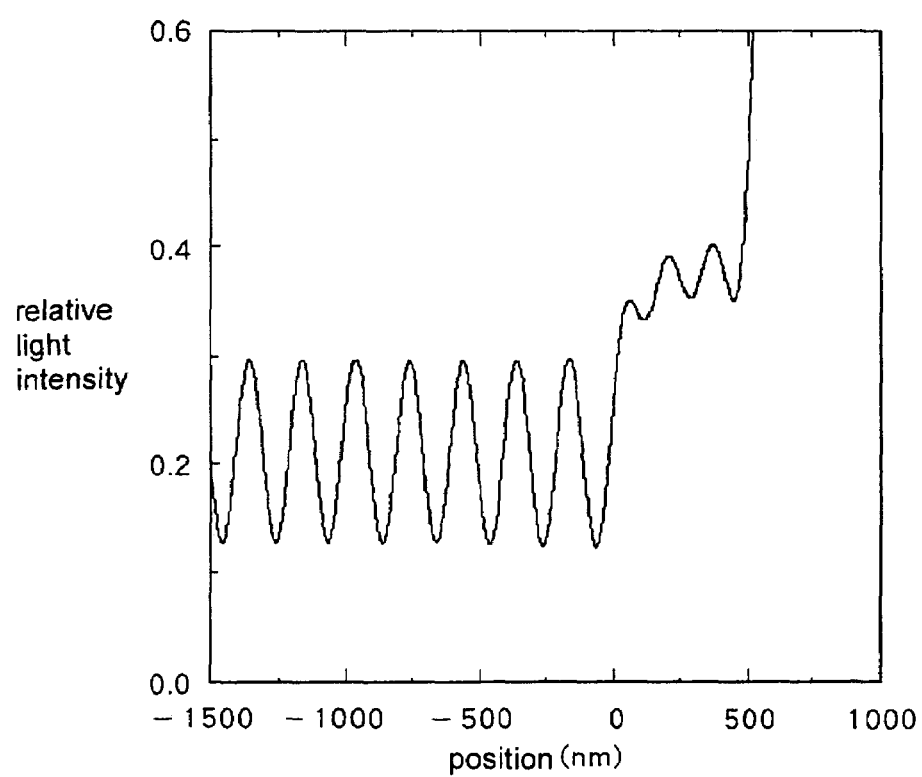
FIG. 7 shows another example of the distribution of the intensity of exposure light.

Here, if a reduction in contrast is not a cause for concern, the dimensions of the outermost line can be set to the designed value by arranging the auxiliary mask patterns closer to the main mask pattern. However, in the region inward from the main mask pattern that corresponds to the outermost line, the maximum value and minimum value of light intensity are not uniform, and as a result, variation will occur in the dimensions of the inner lines. The graph shown in FIG. 7 shows the distribution in the intensity of exposure light when using a mask in which three auxiliary mask rows are arranged. This graph shares the characteristic with the graph shown in FIG. 3 of showing the distribution in the intensity of exposure light when using a mask in which three auxiliary mask rows are provided. However, there is a slight difference in the mask that is used. More specifically, the distribution of light intensity shown in FIG. 3 is the distribution of light intensity when using the mask shown in FIG. 2, i.e., a mask in which the width of main mask pattern 10a that corresponds to the outermost line 3a shown in FIG. 1 is 3 nm greater than that of the other main mask patterns 10. However, the distribution of light intensity shown in FIG. 7 is a distribution of light intensity when using a mask in which the width of all main mask patterns is identical (100 nm). From the two graphs, it can be seen that, by arranging three auxiliary mask rows outside the main mask pattern that corresponds to the outermost line, the maximum value and minimum value of the distribution of light intensity at the periphery of the main mask pattern can be fixed, and the dimensions of lines other than the outermost line can be set to the designed values. It can further be understood that, by adding a slight bias in the main mask pattern that corresponds to the outermost line, the dimensions of the outermost line can also be made the designed value. The addition of the bias in this case means that, anticipating that lines that are transferred (offset) will be thinner than the designed values, the width of the mask is made slightly greater than the designed values of the lines.

Figure 8:
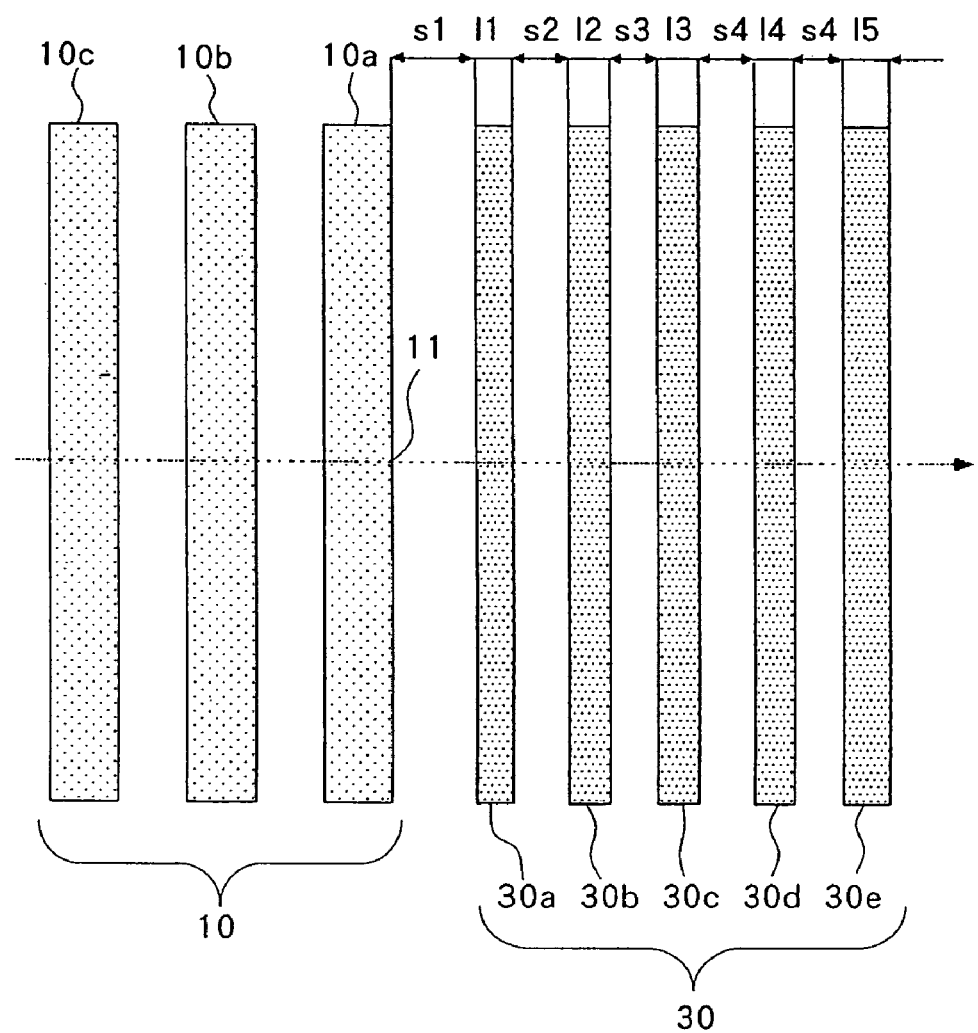
FIG. 8 is a schematic view showing another example of a mask used in the circuit pattern exposure method of the present invention.

FIG. 8 shows yet another example of a mask that is used in the circuit pattern exposure method of the present invention. This mask shares the basic configuration of the mask shown in FIG. 4, and configurations that are identical to those of the mask shown in FIG. 4 are therefore given the same reference numbers, and explanation of these configurations is here omitted. As the point of difference between the mask shown in FIG. 8 and the mask shown in FIG. 4, in contrast to auxiliary mask rows 20a-20e shown in FIG. 4 which are each composed of a plurality of micro-masks 21 arranged in dot form, auxiliary mask rows 30a-30e shown in FIG. 8 are each a single continuous line.

Table 3 shows each of the dimensions of auxiliary mask rows 30a-30e that are shown in FIG. 8. The number of auxiliary mask rows can be increased or decreased. In addition, when the number of auxiliary mask rows is increased or decreased, the dimensions of each row can be modified as appropriate. Table 3 shows each of the dimensions for cases in which the number of auxiliary mask rows ranges from one row to five rows. In FIG. 8, five auxiliary mask rows are arranged, and the numerical values in the extreme right column of Table 3 are the dimensions of auxiliary mask rows 30a-30e. The dimensions shown in Table 3 are an example.

Table 3

Next, Table 4 shows the results of measuring dimensions (line widths) of circuit patterns that have been exposed by masks in which auxiliary mask rows are added one by one, such as a mask in which auxiliary mask patterns 30 shown in FIG. 8 are not arranged (a mask having only main mask patterns 10), a mask in which only one auxiliary mask row 30a is arranged in addition to main mask patterns 10, a mask in which auxiliary mask rows 30a and 30b are arranged, and so on. The numbers of the column on the extreme left of Table 4 show the positions of lines in the exposed circuit pattern. More specifically, these numbers indicate the position of each line when the outermost line is taken as reference, "1" being the outermost line, "2" being the line that is one line inward from the outermost line (the second line), and "3" being the line that is two lines inward (the third line). The exposure conditions in this measurement are similar to the previously described conditions.

Table 4

Figure 9:
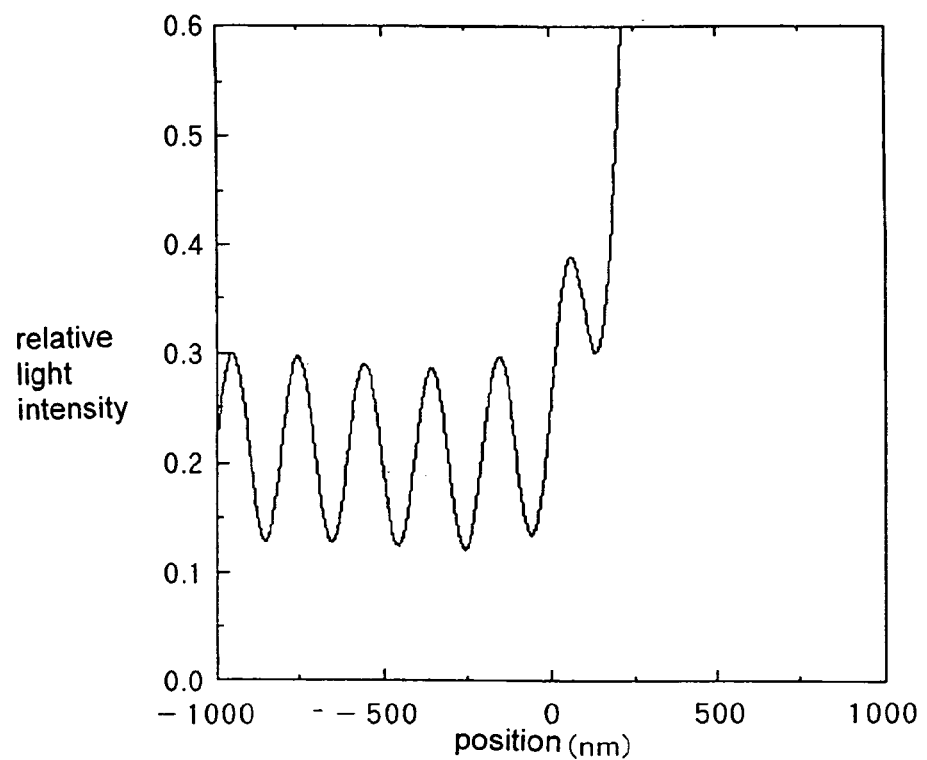
FIG. 9 shows another example of the distribution of the intensity of exposure light.

From Table 4, it can be understood that, when line-shaped auxiliary mask rows are arranged, arranging two or more auxiliary mask rows in addition to main mask patterns 10 enables a reduction of variation in the dimensions of lines in the outer periphery of the circuit pattern. The graph shown in FIG. 9 shows the distribution of the intensity of exposure light when using a mask in which only one auxiliary mask row has been arranged in the above-described measurement. The "0" position of the horizontal axis corresponds to the position of edge 11 of main mask pattern 10a shown in FIG. 8. From this graph, it can be seen that, similar to an auxiliary mask pattern that is made up from interspersed micro-masks, merely arranging a single auxiliary mask row does not enable sufficient suppression of fluctuation of the maximum value and minimum value of the distribution of intensity of exposure light at edge 11 of main mask pattern 10a, and variation therefore occurs in the dimensions of the lines.

Figure 10:
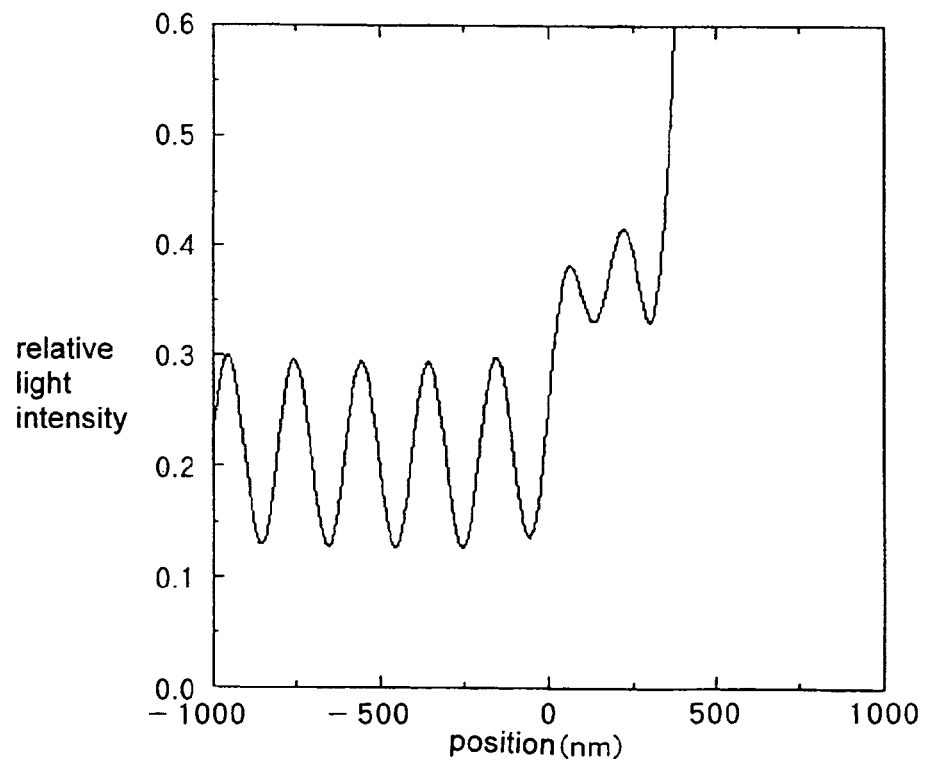
FIG. 10 shows another example of the distribution of the intensity of exposure light.

On the other hand, the graph that is shown in FIG. 10 shows the distribution of the intensity of exposure light when using a mask in which two auxiliary mask rows have been arranged in the above-described measurement. The pitch of the auxiliary mask is narrower than the pitch of the intended lines (i.e., the pitch of the main mask patterns). From this graph, it can be seen that two auxiliary mask rows arranged at a narrow pitch suppress a steep change in light intensity at edge 11 of main mask pattern 10a and thus maintains a uniform light intensity distribution.

Figure 11:
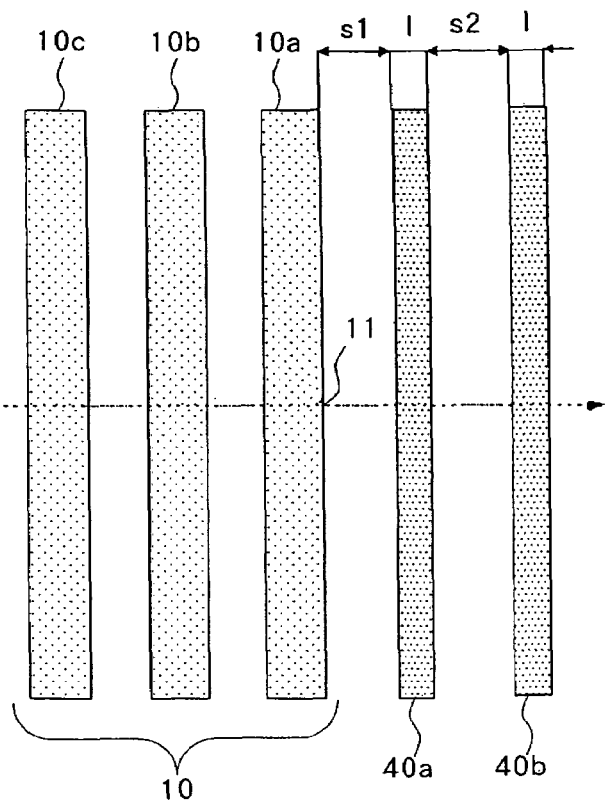
FIG. 11 shows an example of mask in which the pitch of the auxiliary mask rows is wide.
Figure 12:
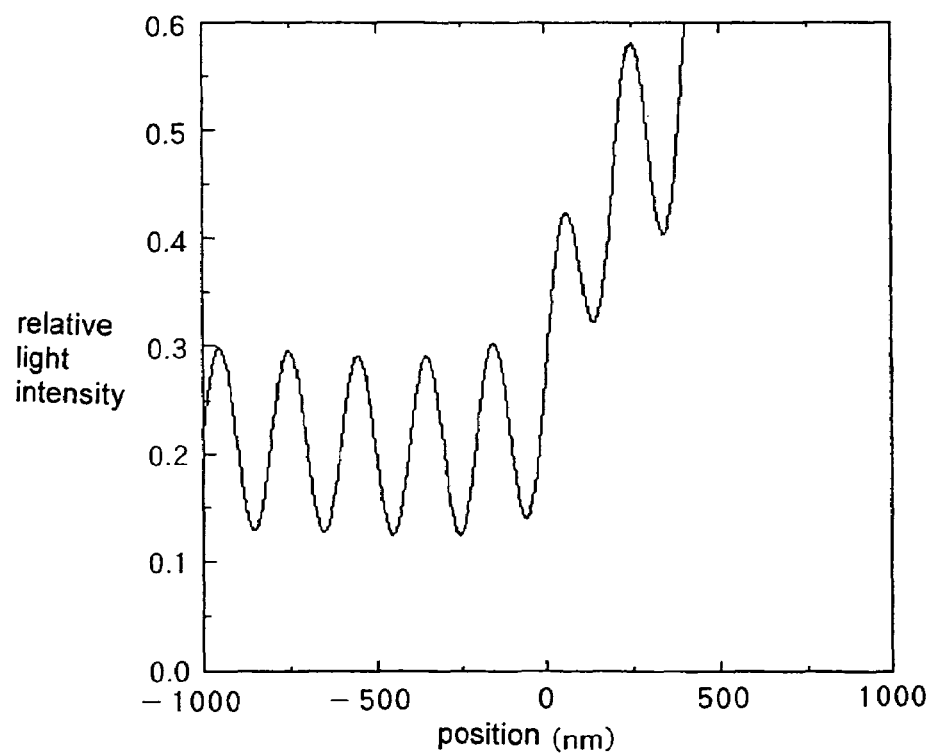
FIG. 12 shows the distribution of the intensity of exposure light when using the mask shown in FIG. 11.

As a comparative example, FIG. 11 shows an example of a mask in which two auxiliary mask rows are arranged at the same pitch as the pitch of the intended lines (i.e., the pitch of the main mask patterns). In FIG. 11, the widths (1) of first auxiliary mask row 40a and second auxiliary mask row 40b are both 50 nm. In addition, the spacing (s1) between first auxiliary mask row 40a and main mask pattern 10a is 120 nm. Further, the spacing (s2) between first auxiliary mask row 40a and second auxiliary mask row 40b is 145 nm, and the pitch is 200 nm. FIG. 12 shows the distribution of the intensity of exposure light when using the mask shown in FIG. 11. From this graph, it can be seen that when the pitch of auxiliary mask rows is great, the maximum value and minimum value of the light intensity in the auxiliary mask rows becomes well-defined. The minimum light intensity in the auxiliary mask patterns must be set to at least a certain limit value so that the auxiliary mask patterns themselves are not transferred (offset) on the semiconductor substrate, and the maximum value of light intensity in the auxiliary mask pattern is rather high. As a result, the light intensity undergoes a steep change at the edge of main mask pattern 10a shown in FIG. 11, and fluctuation in the dimensions of the lines that are transferred (offset) cannot be adequately prevented. When using the mask shown in FIG. 11 to transfer (offset) a circuit pattern, the width of the outermost line (first line) that corresponds to main mask pattern 10a was 83 nm. The width of the second line that corresponds to main mask pattern 10b was 102 nm, and the width of the third line that corresponds to main mask pattern 10c was 104 nm. Similarly, the width of the fourth line was 101 nm, and the width of the fifth line was 99 nm. In other words, the trend for the width of the outermost line to be extremely small and the width of the third line to be particularly great was not adequately improved.

As can be understood from the foregoing explanation, the present invention can prevent steep changes in the intensity of the exposure light at the ends of the L/S pattern, and with the exception of the outermost line and the line that is one line inward from the outermost line, can form all lines to the width that accords with designed values. It can also be understood that by adding a bias to the corresponding mask patterns, adjustment can be made to the desired dimensions for the outermost line and the line that is one line inward from the outermost line. As a result, the objects of correction can be limited to the outermost line and to the line that is one line inward from the outermost line when correction is performed by automatic correction by means of an OPC (Optical Proximity Correction) tool instead of manual correction, whereby the major portion of a data array structure can be maintained. The ability to maintain the array structure of a repeating pattern has the advantages of constraining an increase in the amount of data after OPC and of facilitating mask fabrication.

Although an embodiment of the present invention has been explained by taking the formation of L/S patterns as an example, the present invention can also be applied to the formation of slit patterns or hole patterns. In such cases, the conversion of the auxiliary mask patterns to micro-hole patterns or to slit patterns can be easily understood. In addition, no limitations exist regarding the wavelength of the exposure light (g/l ray or ArF excimer laser) or the type of mask (phase-shift mask/light shielding mask, transmissive or reflective).

While preferred embodiments of the present invention have been described using specific terms, such description is for illustrative purposes only, and it is to be understood that changes and variations may be made without departing from the spirit or scope of the following claims.

TABLE 1

|  |  | One auxiliary mask row | Two auxiliary mask rows | Three auxiliary mask rows | Four auxiliary mask rows | Five auxiliary mask rows |
|---|---|---|---|---|---|---|
| First auxiliary mask row 20a | d1 | 85 | 85 | 85 | 85 | 85 |
|  | w1 | 100 | 100 | 100 | 100 | 100 |
|  | l1 | 80 | 70 | 70 | 70 | 70 |
|  | s1 | 60 | 70 | 70 | 70 | 70 |
| Second auxiliary mask row 20b | d2 | — | 70 | 70 | 70 | 70 |
|  | w2 | — | 100 | 100 | 100 | 100 |
|  | l2 | — | 90 | 75 | 75 | 75 |
|  | s2 | — | 50 | 65 | 65 | 65 |
| Third auxiliary mask row 20c | d3 | — | — | 70 | 70 | 70 |
|  | w3 | — | — | 100 | 100 | 100 |
|  | l3 | — | — | 90 | 75 | 75 |
|  | s3 | — | — | 50 | 65 | 65 |
| Forth auxiliary mask row 20d | d4 | — | — | — | 70 | 70 |
|  | w4 | — | — | — | 100 | 100 |
|  | l4 | — | — | — | 90 | 75 |
|  | s4 | — | — | — | 50 | 65 |
| Fifth auxiliary mask row 20e | d5 | — | — | — | — | 70 |
|  | w5 | — | — | — | — | 100 |
|  | l5 | — | — | — | — | 90 |
|  | s5 | — | — | — | — | 50 |

(nm)

TABLE 2

| Position of line based on the outmost line as reference | No auxiliary mask row | One auxiliary mask row | Two auxiliary mask rows | Three auxiliary mask rows | Four auxiliary mask rows | Five auxiliary mask rows |
|---|---|---|---|---|---|---|
| 1 | 55 | 90 | 96 | 94 | 90 | 87 |
| 2 | 101 | 107 | 104 | 100 | 98 | 97 |
| 3 | 109 | 106 | 102 | 100 | 100 | 101 |
| 4 | 104 | 101 | 100 | 100 | 101 | 101 |
| 5 | 100 | 99 | 100 | 101 | 101 | 101 |
| 6 | 98 | 99 | 100 | 100 | 100 | 100 |
| 7 | 99 | 100 | 101 | 101 | 101 | 101 |
| 8 | 99 | 100 | 100 | 100 | 100 | 100 |

(nm)

TABLE 3

| | | One auxiliary mask row | Two auxiliary mask rows | Three auxiliary mask rows | Four auxiliary mask rows | Five auxiliary mask rows |
|---|---|---|---|---|---|---|
| First auxiliary mask row 30a | l1 | 65 | 50 | 50 | 50 | 50 |
| | s1 | 120 | 125 | 125 | 125 | 125 |
| Second auxiliary mask row 30b | l2 | — | 65 | 55 | 55 | 55 |
| | s2 | — | 110 | 115 | 115 | 115 |
| Third auxiliary mask row 30c | l3 | — | — | 65 | 55 | 55 |
| | s3 | — | — | 110 | 115 | 115 |
| Forth auxiliary mask row 30d | l4 | — | — | — | 65 | 55 |
| | s4 | — | — | — | 110 | 115 |
| Fifh auxiliary mask row 30e | l5 | — | — | — | — | 65 |
| | s5 | — | — | — | — | 110 |

(nm)

TABLE 4

| Position of line based on the outmost line as reference | No auxiliary mask row | One auxiliary mask row | Two auxiliary mask rows | Three auxiliary mask row | Four auxiliary mask rows | Five auxiliary mask rows |
|---|---|---|---|---|---|---|
| 1 | 55 | 88 | 89 | 86 | 82 | 81 |
| 2 | 101 | 105 | 100 | 97 | 94 | 92 |
| 3 | 109 | 105 | 101 | 100 | 100 | 99 |
| 4 | 104 | 101 | 101 | 101 | 101 | 101 |
| 5 | 100 | 99 | 99 | 100 | 100 | 100 |

(nm)

What is claimed is:

1. A circuit pattern exposure method for irradiating illumination light onto a mask to transfer (offset) mask patterns that are formed on the mask onto a semiconductor substrate, wherein:

said mask comprises a main mask pattern that is transferred onto said semiconductor substrate and an auxiliary mask pattern that is arranged adjacently to the main mask pattern and that is not transferred onto said semiconductor substrate;

said main mask pattern has a first pitch defined by a line and a space; and said auxiliary mask pattern includes a first auxiliary mask pattern and a second auxiliary mask pattern between the main mask pattern and the first auxiliary mask pattern, the first auxiliary mask pattern having a second pitch defined by a line and a space, the second auxiliary mask pattern having a third pitch defined by a line and space, each of the second and third pitches being smaller than the first pitch.

2. A circuit pattern exposure method for irradiating illumination light onto a mask to transfer (offset) mask patterns that are formed on the mask onto a semiconductor substrate, wherein:

said mask comprises a plurality of main mask patterns that are arranged at a prescribed first pitch and an auxiliary mask pattern that is arranged outside an outermost main mask pattern and that is not transferred onto said semiconductor substrate;

said auxiliary mask pattern is composed of a first auxiliary mask row that is arranged adjacent to the outermost main mask pattern and a second auxiliary mask row that is arranged adjacent to the first auxiliary mask row; and said first auxiliary mask row and said second auxiliary mask row are formed by a plurality of micro-masks arranged along said main mask patterns, and are arranged at a first pitch and a second pitch, respectively, said first pitch and second pitch each being narrower pitch than the first pitch of the arrangement of said main mask patterns.

3. The circuit pattern exposure method according to claim 2, wherein the micro-masks that form said second auxiliary mask row are larger than the micro-masks that form said first auxiliary mask row.

4. The circuit pattern exposure method according to claim 2, wherein the spacing of the arrangement of the plurality of micro-masks that form said second auxiliary mask row is narrower than the spacing of the arrangement of the plurality of micro-masks that form said first auxiliary mask row.

5. The circuit pattern exposure method according to claim 1, wherein the width of an outermost main mask pattern is greater than the width of other main mask patterns.

6. A mask in which mask patterns are formed that are to be transferred (offset) onto a semiconductor substrate; said mask comprising:

a plurality of main mask patterns that are arranged at a first prescribed pitch and an auxiliary mask pattern that is arranged outside an outermost main mask pattern and that is not transferred (offset) to said semiconductor substrate;

wherein said auxiliary mask pattern is composed from a first auxiliary mask row that is arranged adjacent to said outermost main mask pattern at a second pitch and a second auxiliary mask row that is arranged adjacent to said first auxiliary mask row at a third pitch, and said second pitch and said third pitch are each narrower than said first pitch.

7. The mask according to claim 6, wherein the width of an outermost main mask pattern is greater than the width of the other main mask patterns.

8. A mask in which mask patterns are formed that are to be transferred (offset) to a semiconductor substrate; said mask comprising:

a plurality of main mask patterns arranged at a prescribed first pitch, and an auxiliary mask pattern that is arranged outside the outermost main mask pattern and that is not to be transferred (offset) to said semiconductor substrate;

wherein said auxiliary mask pattern is composed of a first auxiliary mask row that is arranged adjacent to said outermost main mask pattern and a second auxiliary mask row arranged adjacent to said first auxiliary mask row; and said first auxiliary mask row and said second auxiliary mask row are formed by a plurality of micro-masks arranged along said main mask patterns, and are arranged at a first pitch and a second pitch, respectively, said first pitch and second pitch each being narrower pitch than the first pitch of the arrangement of said main mask patterns.

9. The mask according to claim 8, wherein micro-masks that form said second auxiliary mask row are larger than micro-masks that form said first auxiliary mask row.

10. The mask according to claim 8, wherein the spacing of the arrangement of the plurality of micro-masks that form said second auxiliary mask row is narrower than the spacing of the arrangement of the plurality of micro-masks that form said first auxiliary mask row.

* * * * *